(12) United States Patent
Nakamura et al.

(10) Patent No.: US 6,745,825 B1
(45) Date of Patent: Jun. 8, 2004

(54) PLATE TYPE HEAT PIPE (75) Inventors: Yoshio Nakamura, Tokyo (JP); Jun Niekawa, Tokyo (JP); Hisao Enomoto, Tokyo (JP); Yasushi Kojima, Kanagawa (JP); Naoya Yamazaki, Kanagawa (JP); Masahiro Mogi, Kanagawa (JP)

(73) Assignee: Fujitsu Limited (JP)

( * ) Notice: Subject to any disclaimer, the term of this patent is extended or adjusted under 35 U.S.C. 154(b) by 371 days.

(21) Appl. No.: 09/712,582

(22) Filed: Nov. 14, 2000

Related U.S. Application Data (63) Continuation-in-part of application No. 09/041,197, filed on Mar. 12, 1998, now abandoned.

(30) Foreign Application Priority Data

Mar. 13, 1997 (JP) .............................................. 9-058199

(51) Int. Cl.⁷ .............................................. F28D 15/00
(52) U.S. Cl. .............................. 165/104.26; 165/104.33
(58) Field of Search ....................... 165/104.33, 104.26; 29/890.032

(56) References Cited

U.S. PATENT DOCUMENTS

| 4,231,423 A | 11/1980 | Haslett |
| 4,523,636 A | 6/1985 | Meijer et al. |
| 4,890,668 A | 1/1990 | Cima |
| 5,029,389 A | 7/1991 | Tanzer |
| 5,201,196 A | 4/1993 | Faghri |
| 5,427,174 A | 6/1995 | Lomolino, Sr. et al. |
| 5,465,782 A | 11/1995 | Sun et al. |
| 5,522,455 A | 6/1996 | Brown et al. |
| 5,642,775 A | 7/1997 | Akachi |
| 5,660,229 A | 8/1997 | Lee et al. |
| 5,697,428 A | 12/1997 | Akachi |
| 5,704,415 A | 1/1998 | Suzuki et al. |
| 5,785,088 A | 7/1998 | Pai |
| 6,148,906 A | * 11/2000 | Li et al. ............. 165/104.26 X |

FOREIGN PATENT DOCUMENTS

| DE | 2110865 | 1/1972 | |
| JP | 0042094 | 4/1981 | |
| JP | 0028990 | 2/1982 | |
| JP | 0012990 | 1/1983 | |
| JP | 0096992 | 6/1983 | |
| JP | 0127091 | 7/1983 | |
| JP | 0153096 | * 8/1984 | ............ 165/104.21 |
| JP | 0083587 | 4/1988 | |
| JP | 04-260791 | 9/1992 | |
| SU | 276093 | 10/1970 | |
| SU | 0559099 | 7/1977 | |
| SU | 0808826 | 3/1981 | |
| SU | 0853348 | 8/1981 | |
| SU | 00879242 | 11/1981 | |
| SU | 0987357 | 1/1983 | |
| SU | 1592715 | 9/1990 | |
| SU | 1768915 | 10/1992 | |

* cited by examiner

*Primary Examiner*—Christopher Atkinson
(74) *Attorney, Agent, or Firm*—Cantor Colburn LLP (57) ABSTRACT

A sealed plate type metallic heat pipe is disclosed having multiple independent through holes which run through the inside of the heat pipe. All of the through holes are connected in fluid communication at each end. A working fluid is disposed in the through holes and a wire or a wire mesh is disposed in at least one of the through holes.

3 Claims, 8 Drawing Sheets

PLATE TYPE HEAT PIPE

This is a continuation-in-part application of U.S. patent application Ser. No. 09/041,197 filed on Mar. 12, 1998 now abandoned, which claims priority from Japanese Application No. 9-058199 filed on Mar. 13, 1997.

FIELD OF THE INVENTION

The present invention relates to a plate type heat pipe, which is especially suitable as a cooling device for a small-sized computer, such as a notebook computer.

BACKGROUND OF THE INVENTION

Various instruments, such as personal computers, or electric parts, such as semiconductor devices, mounted on electric and electronics appliances, such as electric power devices, inevitably generate heat to some extent when in use. The technique to cool such instruments and electric parts has become an important technical focus. Various methods for cooling electric parts (hereinafter referred to as "parts to be cooled"), are known and include, for example, a method for cooling the air temperature inside the instrument by fixing fans thereto, and a method for cooling the parts to be cooled by fixing a cooling body thereto.

Generally, a plate material made of an excellent heat transfer material such as copper or aluminum is applied to the cooling body fixed to the parts to be cooled. When fins for radiating heat are integrally formed (by cast or forging) to the plate material, the parts to be cooled can be further cooled. Such a cooling body is called a "heat sink".

Recent proposals in this field include a cooling body having a structure of a heat pipe, or a cooling body comprising a plate material having excellent heat transfer properties, such as a copper or aluminum, with a heat pipe further fixed thereto. When a cooling body having the structure of the heat pipe is used, a flat type heat pipe is preferable because of the ease by which it can be fixed to the parts to be cooled.

Although a heat pipe is, generally, circular pipe, as its name describes, a flat type (in flat plate shape) heat pipe is also known. In either kind of heat pipe, there is disposed a hollow space that is a passage for a working fluid within the heat pipe. Heat is transferred within the passage by a phase transition between evaporation and condensation of the working fluid enclosed in the space. The working fluid may be called an operating liquid, however, because it becomes vapor, it is hereinafter called a working fluid.

The heat pipe has a sealed hollow portion in which heat is transferred by the phase transition and the movement of the working fluid enclosed therein. Although heat is transferred, to some extent, by heat conduction through the container forming the heat pipe, the main heat transfer method arises from the heat transfer function of the working fluid inside the heat pipe.

The working fluid in the heat pipe is usually water, aqueous solution, alcohol and other organic solvent. Mercury also may be used as the working fluid in certain cases. As described above, because the heat pipe makes use of phase transition of the working fluid inside the heat pipe, a mixture of gases other than the working fluid sealed inside is preferably excluded upon manufacturing the heat pipe. Usually, carbonic acid gas and the like are mixed in the process of manufacturing the heat pipe or exist in the state of the melt in the working fluid.

There are many heat pipes in a cylindrical shape. However, recently a flat type heat pipe has been effectively used as a cooling apparatus appropriate for cooling electronic parts relating to power electronic fields. The flat type heat pipe is not necessarily limited to a flat plate type; a heat pipe having a bent portion may also be used, (hereinafter "a plate type heat pipe").

Because the plate type heat pipe has a flat plate shape it has an advantage over other heat pipes in that it can be thermally connected to the parts to be cooled without difficulty, for example, when electronic parts such as IC devices are cooled. A radiating heat fin can be fixed in wide area to the plate type heat pipe for more effective use.

In operation, at the heat absorbing side of the heat pipe, the heat conducted through the container that forms the heat pipe evaporates the working fluid. The generated vapor is transferred to the heat radiating side. At the heat radiating side, the vapor of the working fluid is cooled to return to a liquid phase. The working fluid thus returns to the liquid phase and moves again (circulates) to the heat absorbing side. The heat is transferred by the above phase transition of movement of the working fluid.

In the case of a gravity type heat pipe, the working fluid, being in liquid phase by a phase transition, moves to the heat absorbing side by the function of gravity or capillarity. In this case, the heat absorbing side may be placed at a lower position than the heat radiating side.

It is known that the plate is shaped so that the parts to be cooled, such as electronic parts, can be easily contacted in wide area therewith. A plate type heat pipe has been proposed that is formed by welding two flat plates so as to have a sealed hollow portion therebetween. A plate type heat pipe has also been proposed that is formed by joining two flat plates with a release agent partially painted thereon, and pressurizing the joined flat plates to form a sealed hollow portion therebetween. More specifically, the portion painted with release agent expands to form a sealed hollow portion, and the like.

However, although the above-mentioned plate type heat pipe has a flat shaped hollow portion therein, the working fluid moves in multiple directions, thus the heat is not effectively transferred from the heat absorbing side to the heat radiating side.

Incidentally, in case the heat pipe is applied to a cooling mechanism of electronic parts, when the heat absorbing side of the heat pipe is placed below the heat radiating side thereof (hereinafter referred to as "bottom heat mode"), the circulation of the working fluid by gravity can be expected. Accordingly, when electronic parts installed in a steady state inside an apparatus are cooled, it is preferable to place the heat absorbing side below the heat radiating side of the heat pipe. However, this kind of fixed allocation of the heat absorbing and heat radiating sides prevents a free design of the cooling mechanism using the heat pipe.

When a moving machinery and apparatus, a portable electric machinery and apparatus, or an electric control machinery and apparatus fixed to an overhead wire or the like is used, it is expected that the relative location of the heat absorbing side and the heat radiating side will vary. When the heat absorbing side of the heat pipe is placed over the heat radiating side thereof (hereinafter referred to as "top heat mode"), the circulation of the working fluid by gravity can not be expected, thus causing the situation in which the amount of the working fluid is short in the heat absorbing portion, or so called over-boiling.

Even if the top heat mode is applied, when the difference in height between the heat radiating side and the heat absorbing side, or the distance therebetween is small, the above-mentioned problem in relation to the shortage of the working fluid in the heat absorbing portion does not result. However, since the heat pipe is used mainly for the purpose of transferring heat, many times the heat radiating side is required to be separate to some extent, from the heat absorbing side. The limitation that the heat radiating side should be placed near the heat absorbing side restricts the extension in which various machinery and apparatus having a cooling mechanism may be used or operated.

SUMMARY OF THE INVENTION

The object of the present invention is, therefore, to provide a plate type heat pipe that maintains excellent functionality even in the top heat mode, and, furthermore, effectively controls the heat transfer by the working fluid in the intended directions.

In order to attain the above object, there is provided a preferred embodiment of a plate type heat pipe of the present invention, that comprises a sealed plate type metallic heat pipe having multiple independent through holes which run through the inside of said heat pipe, each of said through holes being connected in fluid communication at both ends thereof, a working fluid being enclosed in said through holes and wire or wire mesh being disposed in at least one of said through holes.

There is provided another embodiment of the plate type heat pipe of the present invention, wherein said wire or wire mesh comprises a wire material having a polygonal section.

There is provided another embodiment of the plate type heat pipe of the present invention, wherein said wire material of said wire or wire mesh has grooves formed on a surface thereof.

There is provided an additional embodiment of the plate type heat pipe of the present invention, wherein said wire material of said wire or wire mesh comprises a twisted wire.

There is provided another embodiment of the plate type heat pipe of the present invention, wherein said wire material of said wire or wire mesh is inserted into said through holes in a spiral manner.

There is provided an additional embodiment of the plate type heat pipe of the present invention, wherein a total section of said wire material of said wire or wire mesh occupies 5 to 40% of a total section of said through holes.

There is provided an additional embodiment of the plate type heat pipe of the present invention, wherein said wire or wire mesh comprises a wire material with grooves formed on a surface thereof.

There is provided another embodiment of the present invention, wherein said wire or wire mesh comprises a twisted wire.

There is provided another embodiment of the present invention, wherein said wire or wire mesh is inserted into said through holes in a spiral manner.

There is provided another embodiment of the present invention, wherein a section of said wire or wire mesh occupies 5 to 40% of a total section of said through holes.

There is provided an additional embodiment of the present invention, wherein a part of partition wall separating each of said through holes is removed near each end portion of said multiple through holes so as to connect said multiple through holes and close said each end portion.

There is provided an additional embodiment of the present invention, wherein a cap portion is joined near each end portion of said through holes so as to connect each of said through holes.

There is provided another embodiment of the present invention, that comprises a plate type heat pipe manufactured by the steps of: preparing a pipe having a plurality of independent through holes and a plurality of partition walls, said through holes extending in a longitudinal direction through an inside of said pipe, and defining end portions on opposite ends thereof, said plurality of partition walls being positioned in such a manner that each of said plurality of through holes is separated from every other through hole by one of said plurality of partition walls; removing part of said plurality of partition walls in both said end portions; closing one of said end portions so as to connect each of said plurality of through holes through removed partition walls; disposing one of a movable straight wire and a movable straight wire mesh extending along an axis of said through hole in each of said plurality of through holes in such a manner that a narrow space is formed between said walls forming said through holes and a side portion of said straight wire or wire mesh so as to cause sufficient capillary action between said wall forming said through hole and said straight wire or wire mesh, and receiving working fluid, then, closing the other end of said portions so as to connect each of said plurality of through holes, thus forming a container of a plate type heat pipe; and sealing said container receiving said working fluid.

There is provided another embodiment of the present invention, that comprises a plate type heat pipe, comprising: an extruded pipe having two ends and having a plurality of through holes defined by a plurality of longitudinally extending partition walls having portions removed at the ends of said pipe; a working fluid received in said pipe; two end caps, one positioned at each end of said pipe to hermetically seal said pipe, the working fluid in one through hole communicating with the working fluid in another through holes s a result of said removed portions of said partition walls; one of a non-porous, straight wire and non-porous, straight wire mesh movably positioned within said through hole such that a narrow space is formed between an inner wall of said partition wall forming said through hole and a side portion of said straight wire and wire mesh so as to cause sufficient capillary action.

BRIEF DESCRIPTION OF THE DRAWINGS

FIGS. 2(a and b) is a descriptive view illustrating a method of measuring the heat transfer efficiency of a plate type heat pipe of the present invention;

FIGS. 4(a and b) is a descriptive view illustrating a method of measuring the heat transfer efficiency of a plate type heat pipe of the present invention.

In FIG. 6, the reference numeral 120 is a working fluid. The reference numeral 111 is a removed part of the partition wall. The reference numeral 130 is a cap portion.

DETAILED DESCRIPTION OF PREFERRED EMBODIMENTS

FIG. 1 a is a schematic sectional view illustrating one embodiment of a plate type heat pipe of the present invention. Disposed inside the container 10 are ten individual through holes 11 in series, each separated by a wall 110. Each of the through holes 11 is connected in fluid communication with each other at both ends of the plate type heat pipe 1. Preferably, in each of the through holes 11, there is disposed a wire 12. A wire mesh may be disposed in the through hole in place of the wire 12.

Figure 6:
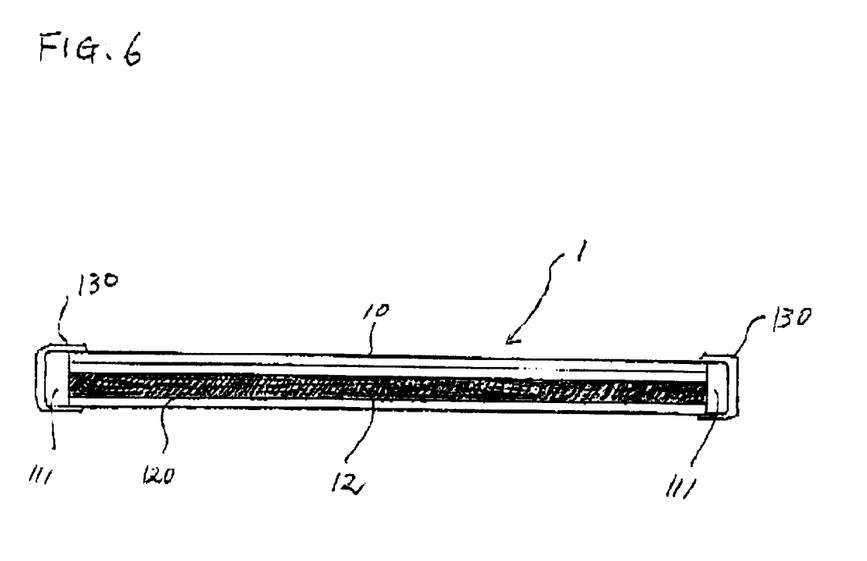
FIG. 6 is a schematic longitudinal sectional view of the heat pipe of the present invention.

In the through holes 11 or the portions connecting through holes at both ends, the required amount of the working fluid 120, shown in FIG. 6 is enclosed. When the above plate type heat pipe is used, it is preferable to place the heat absorbing portion and the heat radiating portion in such manner that the heat is transferred by the working fluid in a longitudinal direction of the through hole. The effective cooling mechanism can be obtained in accordance with the above manner.

Although there is shown in FIG. 1a an example of the plate type heat pipe 1 with ten individual through holes 11 disposed therein, any number of the through holes 11 may be selected. Furthermore, although FIG. 1a shows a wire 12 is disposed in all the through holes 11, a wire 12 maybe disposed in only some of the through holes 11.

The wire 12 is disposed in the through hole 11 in such manner that a narrow space is formed so as to cause enough capillary action between the inner wall of the through hole 11 and the wire. Because of the capillary action by the above space, the circulation of the working fluid can be satisfactorily maintained even in the top heat mode of the heat pipe. Therefore, the heat transfer efficiency can be satisfactorily maintained even in the top heat mode of the heat pipe, according to the present invention.

The wire 12 is disposed in the through hole 11 so as to occupy 5 to 40% of the section of the through hole 11. When the wire 12 occupies over 40% of the section of the through hole 11, the passage for the working fluid in vapor is narrowed, thus increasing the resistance to transfer of the vaporized working fluid in the though hole 11.

As described above, the wire 12 may be disposed in only some of the through holes 11. When the wire is disposed in all of the through holes, the total volume of the passages for the vaporized working fluid becomes small. Accordingly, the number of through holes 11 with the wire 12 disposed therein is selected in accordance with a required effect.

As shown in FIG. 1b, the wick 12 disposed within the through hole may be, for example, a straight wire, a straight wire mesh, a non-porous straight wire or a non-porous straight wire mesh. The straight wick is disposed within the through hole in such a manner that the side portion of the straight wick contacts with at least part of the inner wall of the through hole so as to form a narrow space to cause strong capillary action between the wick and the inner wall of the through hole.

Since the above-mentioned straight wick is disposed so as to move within the through hole, even if the container 10 is inclined, or placed upside down, the side portion of the straight wick always contacts with the part of the inner wall of the through hole, that is, the inner side wall, the inner lower wall, or the inner upper wall, so as to form a narrow space to cause strong capillary action between the wick and the inner wall of the through hole.

As described above, the wick of the present invention may be a movable straight wire, a moveable straight wire mesh, a non-porous straight wire movably positioned or a non-porous straight wire mesh movably positioned. Accordingly, by simply disposing the above-mentioned straight wire, straight wire mesh, non-porous straight wire or non-porous straight wire mesh within the through hole so as to be movably positioned, the heat pipe which has at least the same excellent capillary action as the heat pipe with a wick of complex structure disposed therein can be provided, thus remarkably reducing a manufacturing cost. Furthermore, as described above, according to the present invention, even if the container is inclined or placed upside down, a sufficient circulation of the working fluid can be maintained, thus the heat pipe having an excellent heat transfer function can be provided.

The plate type heat pipe of the present invention is preferably constructed so that the wire or wire mesh has a polygonal cross section, the wire or wire mesh has grooves formed on a surface thereof, the wire or wire mesh comprises a twisted wire, the wire or wire mesh is inserted into each of the through holes in spiral manner, or the wire or wire mesh occupies 5 to 40% of the section of the through holes in which the wire or wire mesh is disposed.

Figure 7:
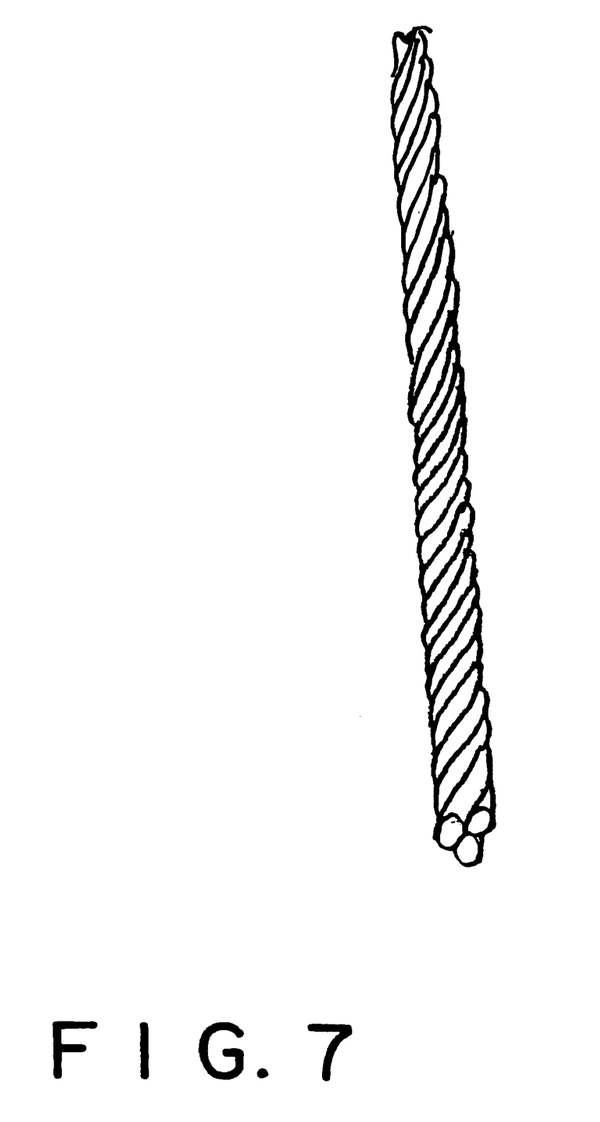
FIG. 7 is a perspective view illustrating another embodiment of the wire material of the present invention wherein the wire or wire mesh comprises a twisted wire.

FIG. 7 illustrates a perspective view of an embodiment of the wire material of the present invention wherein the wire or wire mesh comprises a twisted wire.

The plate type heat pipe of the present invention can be manufactured by the following method: a pipe having multiple through holes for forming a container of a plate type heat pipe is prepared. Then, part of partition walls 111, shown in FIG. 6 of the multiple through holes in both end portions of the through holes are removed, and both end portions are closed so as to connect each of the multiple through holes, thus forming the container of the plate type heat pipe. Then, a wire or wire mesh is disposed in some of the through holes of the multiple through holes within the container. Then, a working fluid is received in the multiple through holes. Finally, the container receiving the working fluid is sealed.

The plate type heat pipe of the present invention also, may be manufactured by the following method: a pipe having multiple through holes for forming a container of a plate type heat pipe is prepared. Then, a cap material 130, shown in FIG. 6, is joined to each of both ends of the multiple through holes to connect each of the multiple through holes, thus forming the container of the plate type heat pipe. Then, a wire or a wire mesh is disposed in some of the through holes of the multiple through holes within the container. Then, a working fluid is received in the multiple through holes. Finally, the container receiving the working fluid is sealed.

EXAMPLES

Example 1

Figure 1:
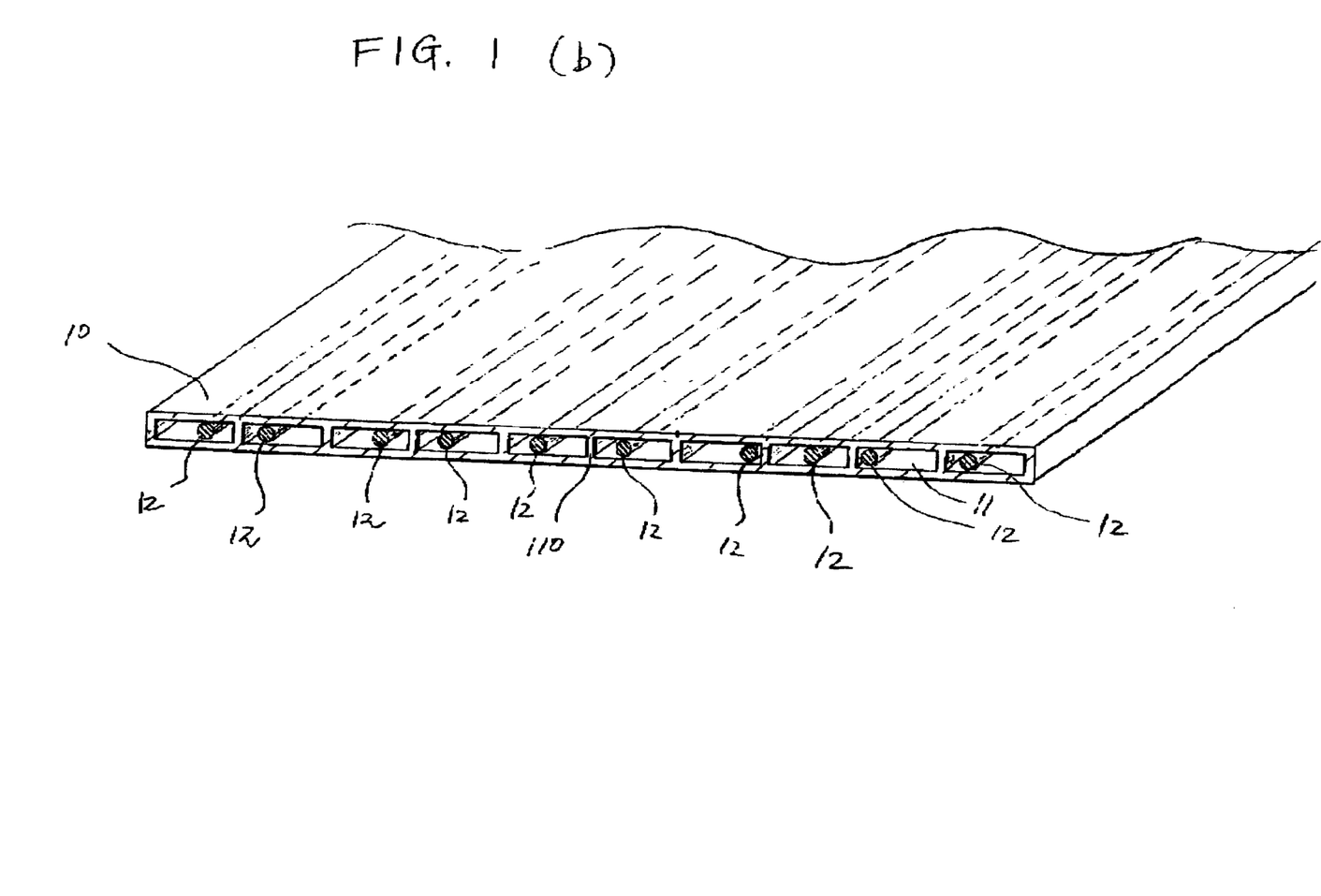
FIG. 1a is a schematic cross sectional view illustrating one embodiment of a plate type heat pipe of the present invention.
FIG. 1b is a schematic cross sectional view illustrating one embodiment of a plate type heat pipe of the present invention.
Figure 1A:
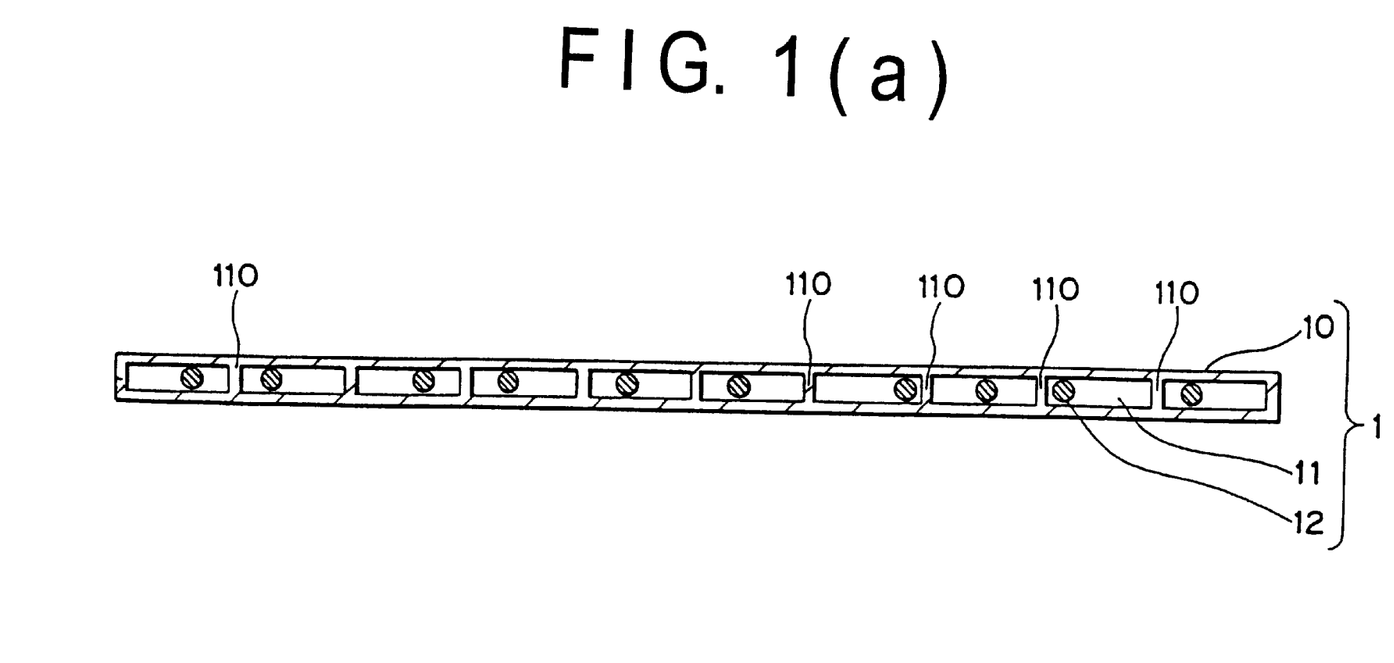

The plate type heat pipe 1 of the present invention having a cross section shown in FIG. 1 was prepared. A plate type heat pipe 1 was manufactured as follows: a rectangular pipe having rectangular multiple through holes was manufactured from the plate having the thickness of 2 mm and the width of 60 mm by an extrusion method with multiple holes so as to have, in series, ten rectangular through holes having a cross section measuring 4.45 mm×1 mm therein. Then, the cap material was fixed to both ends of the rectangular pipe having rectangular multiple through holes to connect all of the through holes 11. A pure aluminum material was used for the cap material and for the above rectangular pipe having rectangular multiple through holes.

The inside of the hollow portion formed by the above rectangular pipe having rectangular multiple through holes and the cap material was subjected to a vacuum degassing, and HCFC (substitutions of fleon) was enclosed therein as the working fluid. The wire 12 (made of pure aluminum) having a diameter of 0.8 mm and length of 300 mm was inserted in each of the rectangle through holes 11. The total length of thus manufactured plate type heat pipe of the invention was about 500 mm.

Figure 2A:
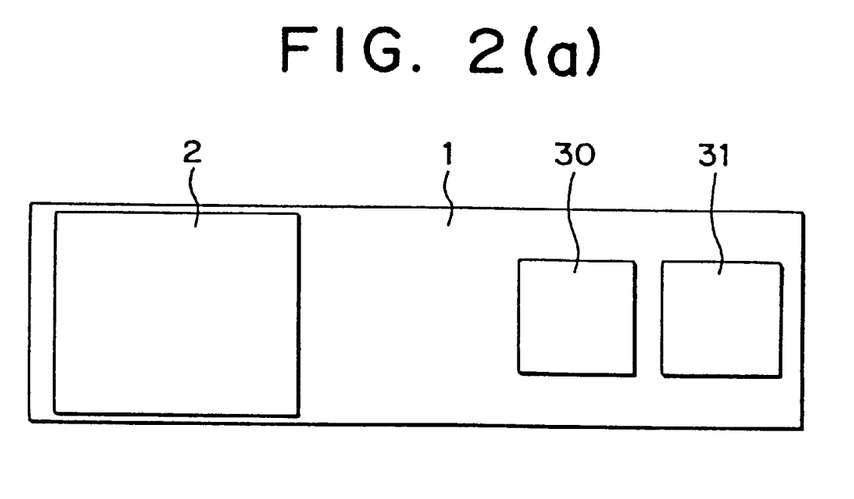
Figure 2B:
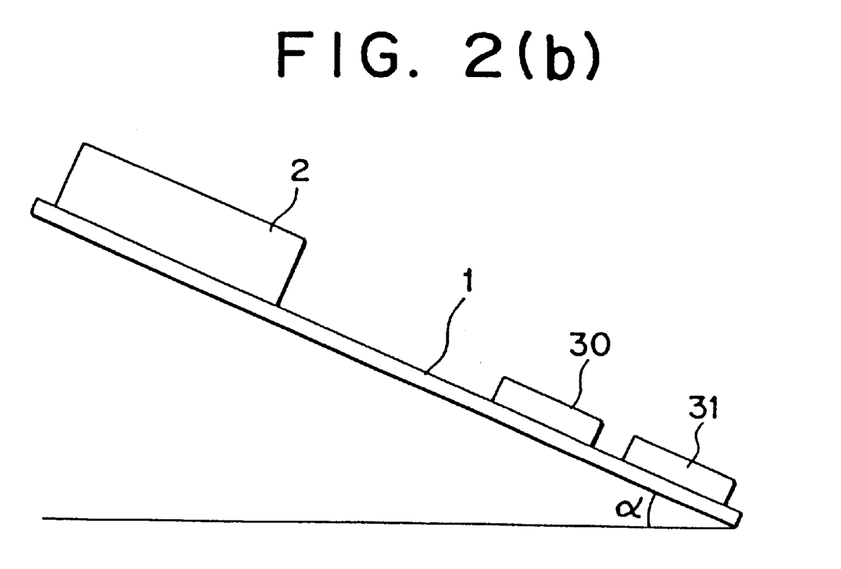

FIGS. 2(a and b) is a descriptive view illustrating a method of measuring the heat transfer efficiency of a plate type heat pipe of the present invention. FIG. 2(a) is a plan view showing that the parts to be cooled 30, 31 (having a size of 30 mm×30 mm) are fixed near one end of the plate type heat pipe 1. A heat radiating fin 2 is fixed near the other end thereof. The wire 12 is disposed about the center of the plate type heat pipe 1 in its longitudinal direction (not shown). FIG. 2(b) is a side view and shows that alpha is an inclination angle from the horizontal plane of the plate type heat pipe.

Then, the parts 30, 31 to be cooled were operated to generate heat (the amount of generated heat was 2 W (watt) in each part to be cooled). Then, the inclination angle alpha was changed. After a required time passed, the average temperature of the portion of the plate type heat pipe to which the parts 30, 31 were fixed and the average temperature of the portion to which the heat radiating fin 2 was fixed were investigated. Then, the difference between the above two average temperatures was obtained. The result is shown in Table 1. In the column of the inclination angle alpha in FIG. 2(b), the mark "+" shows that the end portion to which the heat radiating fin 2 is fixed is above the horizontal plane and the mark "−" shows that the end portion to which the heat radiating fin 2 is fixed is below the horizontal plane.

For comparison, a plate type heat pipe having a sealed single hollow portion without partition walls 110 separating through holes 11 as shown in FIG. 1 was manufactured. In the sealed single hollow portion of the plate type heat pipe for comparison, there were disposed 225 pieces of pillar portions having the diameter of 6 mm in approximately balanced allocation for the purpose of enhancing the strength of the heat pipe.

Neither the wire nor wire mesh was disposed in the plate type heat pipe for comparison. The remaining conditions, including the working fluid and materials, were the same as that of the invention. The plate type heat pipe for comparison was evaluated in the same manner as shown in FIGS. 2(a) and (b). In the plate type heat pipe for comparison, when the inclination angle alpha became larger than −10, i.e., the end portion to which the heat radiating fin 2 is fixed becomes lower in FIG. 2(b), the working fluid became short in the portion of the plate type heat pipe to which the parts 30, 31 were fixed. The results are shown in Table 1.

As shown in Table 1, with respect to the plate type heat pipe of the present invention, even when the inclination angle was minus (−), i.e., the top heat mode in which the parts 30, 31 to be cooled are placed above the heat radiating fin 2, the difference of the temperature of the parts 30, 31 was small, thus excellent heat efficiency was obtained. On the other hand, in the plate type heat pipe for comparison, when the inclination angle was minus (−), i.e., the top heat mode, the difference of the temperature of the parts 30, 31 was large, thus heat efficiency was remarkably lowered.

Example 2

Figure 3:
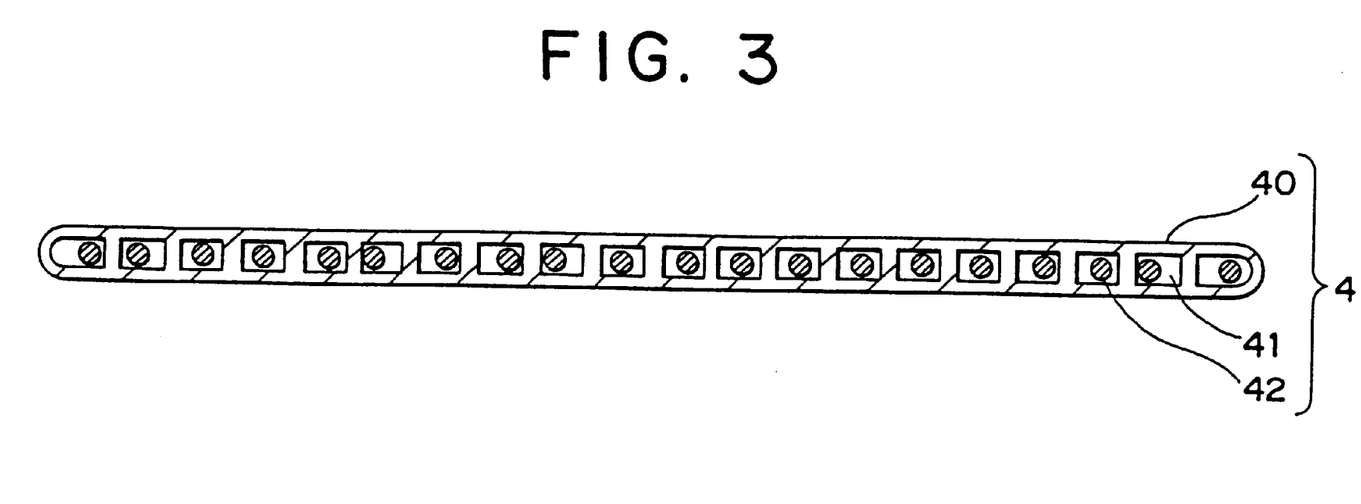
FIG. 3 is a schematic cross sectional view illustrating another embodiment of a plate type heat pipe of the present invention.

The plate type heat pipe 4 of the present invention having a section shown in FIG. 3 was prepared. The plate type heat pipe 4 was manufactured as follows: a rectangular pipe having rectangular multiple through holes 41 was manufactured from the plate having the thickness of 1.9 mm and the width of 50 mm by an extrusion method with multiple holes so as to have in series 41 individual rectangular through holes 41 having a cross section measuring 2.0 mm×0.9 mm therein. Then, the cap material was fixed to both ends of the rectangular pipe having rectangular multiple through holes to connect all the through holes 41. A pure aluminum material was used for the cap material and for the above rectangular pipe having rectangle multiple through holes.

The inside of the hollow portion formed by the above rectangular pipe having rectangular multiple through holes and the cap material was subjected to a vacuum degassing, and HCFC was received therein as the working fluid. The wire 42 made of pure aluminum having the diameter of 0.5 mm and length of 410 mm was inserted in each of the rectangular through holes 41. The total length of thus manufactured plate type heat pipe 4 of the invention was about 450 mm.

Figure 4A:
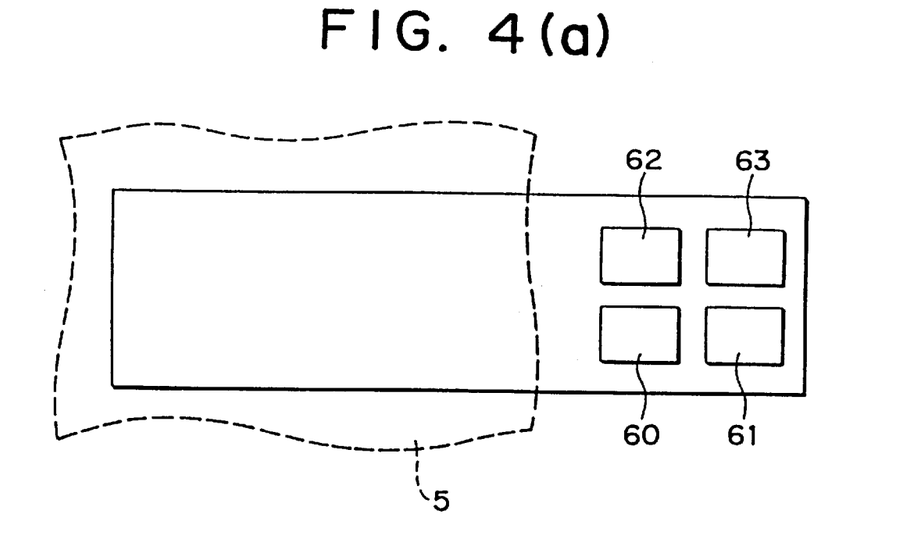
Figure 4B:
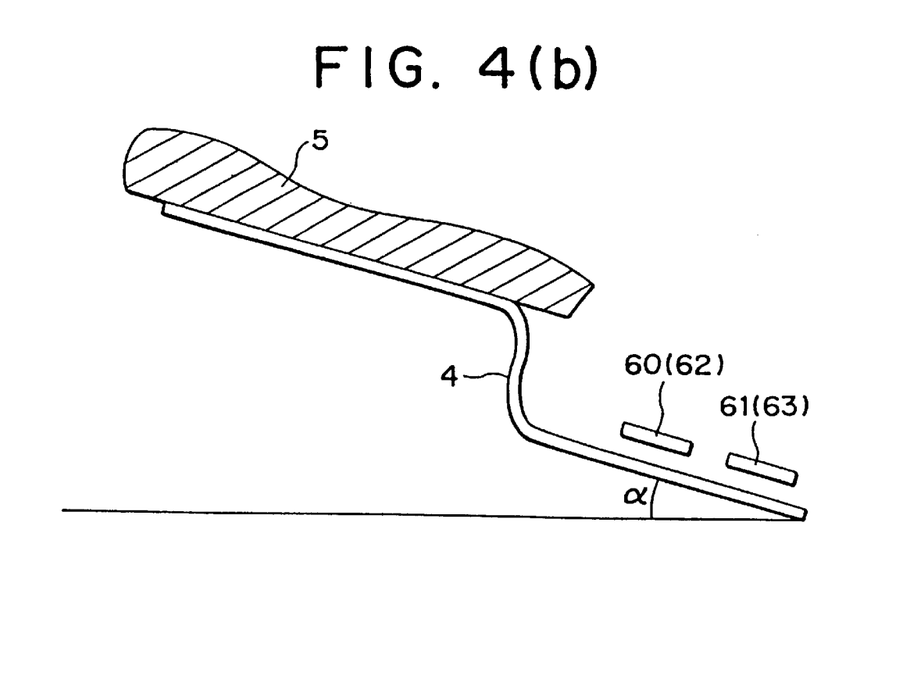

FIGS. 4(a and b) is a descriptive view illustrating a method of measuring the heat transfer efficiency of a plate type heat pipe 4 of the present invention. FIG. 4(a) is a plan view showing that the parts 60–63 to be cooled (having a size of 20 mm×30 mm) are fixed near to one end of the plate type heat pipe 4, a basket of an electric machinery and apparatus in which the parts 60–63 to be cooled are accommodated is thermally connected near to the other end thereof. The heat is transferred to the one end of the plate type heat pipe 4 by the radiating heat from the parts 60–63 to be cooled and the heat transfer through the surrounding air.

FIG. 4(b) is a side view and shows that alpha is an inclination angle from the horizontal plane of the plate type heat pipe. The plate type heat pipe 4 was bent in its intermediate portion as shown in FIG. 4(b). Then, the parts 60–63 to be cooled were operated to generate heat (the amount of generated heat was 2.5 W in each part to be cooled). Then, the inclination angle alpha was changed. After required time passed, the average temperature of the portion of the plate type heat pipe to which the parts 60–63 were fixed and the average temperature of the portion to which the basket of the electric machinery and apparatus 5 was fixed were investigated. Then the difference between the above two average temperatures was obtained. The result is shown in Table 2. In the column of the inclination angle alpha in FIG. 4(b), the mark "+" shows that the end portion to which the basket of the electric machinery and apparatus 5 is fixed is above the horizontal plane and the mark "−" shows that the above end portion is below the horizontal plane.

For comparison, the plate type heat pipe for comparison without the wire mesh 42 as shown in FIG. 3 was manufactured. The remaining conditions including the working fluid and materials were the same as that of the invention. The plate type heat pipe for comparison was evaluated in the same manner as shown in FIGS. 4(a) and (b). In the plate type heat pipe for comparison, when the inclination angle alpha became larger than −10, i.e., the end portion to which the basket 5 is fixed becomes lower in FIG. 4(b), the working fluid became short in the portion of the plate type heat pipe to which the parts 60–63 were fixed. The results are shown in Table 2.

As shown in Table 2, with respect to the plate type heat pipe of the present invention, even when the inclination angle was minus (−), i.e., the top heat mode in which the parts 60–63 to be cooled are placed above the basket 5, the difference of the temperature of the parts 60–63 was small, thus excellent heat efficiency was obtained. On the other hand, in the plate type heat pipe for comparison, when the inclination angle was minus (−), i.e., the top heat mode, the difference of the temperature of the parts 60–63 is large, thus heat efficiency was remarkably lowered.

As described in detail, according to the present invention, the plate type heat pipe can be provided in which excellent heat transfer efficiency can be obtained with the small temperature difference even in the top heat mode, and furthermore excellent cooling mechanism enabling to respond to the various conditions can be obtained.

Figure 5:
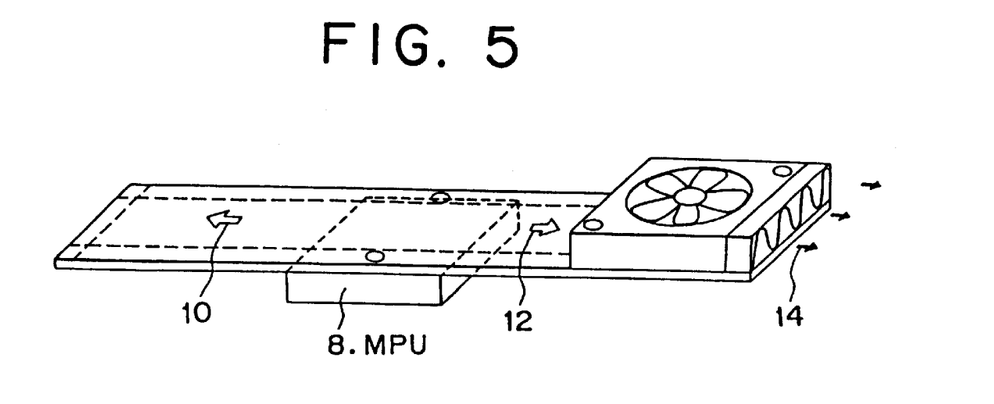
FIG. 5 is a descriptive view of the present plate type heat pipe used for an electronic device such as a computer.

FIG. 5 illustrates an example wherein the present plate type heat pipe is used as a cooling device for a microprocessor 8. The size of the heat pipe is larger than 100 mm in length, 30, 50 and 60 mm respectively in width and 1.3, 1.5 and 1.9 mm respectively in thickness, made of an aluminum metal container enclosing R123 (HCFC, a substitutional fleon) as a working fluid. A microprocessor is attached to the surface of the heat around the center of the heat pipe and a heat radiating fan is attached at the right end of the heat pipe. The heat generated from the microprocessor. (MPU) 8 is extracted in the direction as shown by the arrows 10 and 12 and the extracted heat is further exhausted to the outside of the device by a fan. This configuration of the heat pipe is very appropriate to be installed in a small-sized computer.

TABLE 1

|  |  | Inclination angle alpha (degree) | | | | | | |
|---|---|---|---|---|---|---|---|---|
|  |  | +5 | 0 | −5 | −10 | −15 | −20 | −25 |
| Difference of temperature (degrees in Celsius) | Present Invention | 0.5 | 0.5 | 0.7 | 1.0 | 1.2 | 5.3 | 12.0 |
|  | Comparison | 0.5 | 0.7 | 12.0 | — | — | — | — |

TABLE 2

|  |  | Inclination angle alpha degree | | | | | | |
|---|---|---|---|---|---|---|---|---|
|  |  | +5 | 0 | −5 | −10 | −15 | −20 | −25 |
| Difference of temperature (degrees in Celsius) | Present Invention | 0.5 | 0.5 | 0.6 | 0.7 | 0.9 | 2.5 | 12.5 |
|  | Comparison | 0.5 | 0.7 | 12.0 | — | — | — | — |

What is claimed is:

1. A plate type heat pipe, comprising:

an extruded pipe having two ends and having a plurality of through holes defined by a plurality of longitudinally extending partition walls having portions removed at the ends of said pipe;

a working fluid received in said pipe;

two end caps, one positioned at each end of said pipe to hermetically seal said pipe, the working fluid in one through hole communicating with the working fluid in another through hole as a result of said removed portions of said partition walls;

one of a non-porous, straight wire and non-porous, straight wire mesh movably positioned within said through hole such that a narrow space is formed between an inner wall of said partition wall forming said through hole and a side portion of said straight wire and wire mesh so as to cause sufficient capillary action.

2. A plate type pipe as claimed in claim 1, wherein said wire comprises a twisted wire.

3. A plate type heat pipe as claimed in claim 1, wherein a cap portion is joined near each of said end portions of said through hole.

\* \* \* \* \*